Aug. 24, 1965 R. M. RYON, JR., ETAL 3,202,838
SIGNAL DELAY CIRCUIT
Filed Oct. 9, 1962
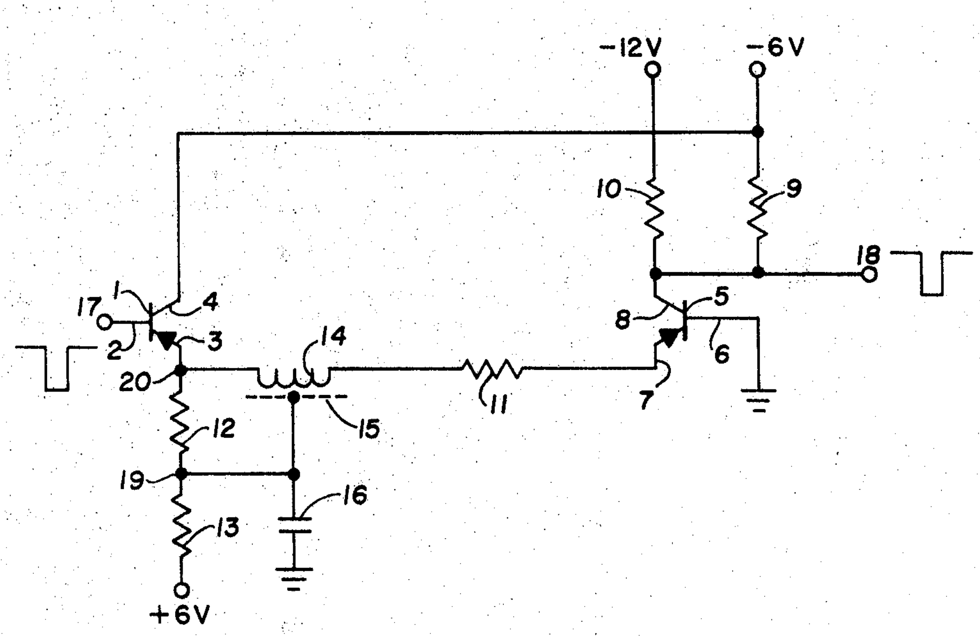
Richard M. Ryon Jr.
Charles T. Ludwig
INVENTORS
BY [signature]
ATTORNEY United States Patent Office 3,202,838
Patented Aug. 24, 1965

3,202,838

SIGNAL DELAY CIRCUIT

Richard M. Ryon, Jr., and Charles T. Ludwig, Houston, Tex., assignors to Texas Instruments Incorporated, Dallas, Tex., a corporation of Delaware Filed Oct. 9, 1962, Ser. No. 229,326
3 Claims. (Cl. 307—88.5)

This invention relates to a signal delay circuit and more particularly to a circuit for reproducing a pulse a predetermined time after the occurrence of an input pulse.

Signal delay circuits may be used wherever it is desired to defer the change in a first circuit to a second circuit to provide timed control of the second circuit, for example, a condition responsive circuit which senses a condition after a predetermined time interval for control and/or indicating purposes. One use would be in digital computer logic circuit design to provide a delayed binary output in response to a digital input.

In digital computer logic circuit design it is desirable to provide low voltage, low impedance, current mode delay circuits which has a fast response to binary information and provide accurate time delays between the occurrence of binary information and its reproduction.

Accordingly, this invention contemplates a signal delay circuit comprising a delay line coupled between an input and output switch for accurately providing time controlled operations of the output switch in response to the condition of the input switch. The input end of the delay line is provided with a matched A.C. impedance termination and the output end is also substantially matched with an impedance termination in order to minimize reflections or ringing in the delay line, thereby ensuring an accurate time controlled response of the switches. Also, stabilized D.C. biasing potentials are applied to the switches and to the delay line to maintain the operating characteristics of the components substantially constant during the wave front transition between the switches when a predetermined condition is sensed by the input switch. Thus, the switches are prevented from responding to spurious signals and hence accurate time control is enhanced. More specifically, a delay line is coupled between an emitter-follower transistor input switch and a grounded-base transistor output switch to provide a compatible signal delay circuit for computer logic circuitry and a current mode, low voltage, low impedance circuit.

Accordingly, an object of this invention is an improved circuit for providing a condition responsive time delay.

Another object of the invention is an improved circuit for reproducing a time delayed output pulse upon the occurrence of an input pulse.

Another object is an improved current mode signal delay circuit for providing a condition responsive time delay.

A further object is an improved signal delay circuit incorporating stabilized D.C. biasing.

The foregoing and other objects, features and advantages will be apparent from the following detailed description, taken in conjunction with the appended claims and attached drawing which constitutes a circuit diagram according to the invention.

Referring to the drawing: emitter-follower transistor 1 comprises the input switch. The −6 v. source connected to collector 4 and the +6 v. source connected to the emitter 3 through load resistors 12 and 13 comprise the D.C. biasing for transistor 1. Said biasing normally maintains transistor 1 in its non-conductive state. Terminal 17 connected to the base 2 is the input terminal for transistor 1. Terminal 20 is the output terminal of transistor 1.

Ground-base transistor 5 comprises the output switch.

The resistors 9 and 10 connected between the −6 v. and −12 v. sources comprise a voltage divider. The junction of resistors 9 and 10 is connected to bias the collector 8 and establish the voltage level at output terminal 18. The +6 v. source connected to emitter 7 by resistors 11, 12 and 13 provides a D.C. bias on said emitter, the resistance of delay line 14 being negligible.

The delay line 14 is connected at its input end to the output of emitter-follower transistor 1 at terminal 20 and connected at its output end to the input of grounded-base transistor 5 through resistor 11. Said delay line may be of the distributed or lumped parameter type, 15 being the reference plane for the delay line. For example, if the delay line is of the distributed parameter type, the reference plane 15 would be the outer conductor of the delay line, the coil 14 being the inner conductor. One terminal of capacitor 16 is connected to reference plane 15 and to the junction 19 of resistors 12 and 13. The other terminal is connected to ground.

A matched A.C. impedance termination is provided at the input end of the delay line by resistor 12 and capacitor 16. The output end of the delay line is substantially matched by resistor 11 and the input impedance of transistor 5. It is desirable that a perfect impedance match exist at the output end of the delay line. However, since transistor 5 input impedance is non-linear and it is desirable to have a low resistance 11, in practice there is a slight mismatch at the output end. This does not effect the operation of the circuit because isolation between the two switches 1 and 5 is maintained by the matched A.C. input termination (resistor 12 and capacitor 16) at the input end of the delay line. Small reflections caused by the mismatched output end of the delay line will be absorbed by the matched input termination and thus will not effect the operation of transistor 1.

The D.C. load lines for transistors 1 and 5 are chosen by the resistors 11, 12 and 13 and the +6 v. source. Emitter-follower transistor 1 load resistor is split to form two resistors 12 and 13. As a result, one of the load resistors 12 is used in conjunction with capacitor 16 for A.C. impedance matching. This allows the correlation of circuit values for choosing the D.C. load line and the A.C. matching impedance with a +6 v. source. However, a suitable voltage source may be connected to junction 19 with the elimination of the split load configuration for performing the same function.

A voltage divider network similar to resistors 9 and 10 may be provided at the collector 4 for providing a trigger bias for transistor 1 without effecting the delay portion of the circuit.

The operation of the circuit is as follows:

In the absence of a negative input pulse at terminal 17, transistor 1 is biased to its non-conductive state and transistor 5, by virtue of the positive bias applied to emitter through resistors 11, 12 and 13, is in its conductive state. Capacitor 16 charges to the D.C. potential of junction 19 from voltage source +6 v., thereby establishing a reference potential at plane 15 for the delay line 14. Since transistor 5 is conductive, a predetermined negative reference level is also established at terminal 18.

When a negative input pulse is applied to terminal 17, transistor 1 is activated and becomes conductive. A negative pulse therefore appears at terminal 20, which is transmitted through the delay line 14 to bias emitter 7 negative with respect to the base 6. Thus transistor 5 is cut off and rendered nonconductive, sensing the negative pulse at terminal 20 after a predetermined time delay provided by delay line 14.

When transistor 5 is switched off, the potential at terminal 18 goes more negative, established thereat by the voltage divider 9, 10. Thus the potential at terminal 18 is switched between two potential levels depending on the state of transistor 5. A pulse is thereby reproduced at terminal 18 whose width is proportional to the pulse width of the input pulse at terminal 17 and whose height is independent of said input pulse. Therefore, if this invention is used for logic design in a digital computer, the height of the output pulse could be set at the logic unit level established by the voltage divider 9, 10. If the height of the input pulse varies from this logic unit level, then the output pulse would still be set at said unit level. Under these conditions, the circuit would act as a level restorer, reproducing a delayed binary signal at the logic unit level.

The D.C. bias on reference plane 15 and emitters 3 and 7 is stabilized and held substantially constant by capacitor 16 during the wave front transition between transistor switches 1 and 5. Capacitor 16 holds the D.C. potential at junction 19 substantially constant upon the occurrence of a negative pulse at terminal 20, and also during the transmission of the pulse through delay line 14 to emitter 7. As a result, transistor 5 is maintained in its conductive state until the negative pulse is transmitted through the delay line 14 to emitter 7. An improved time controlled switching action of transistor 5 is thereby achieved. Also, attenuation and phase distortion in the delay line 14 is minimized by the connection of the stabilized D.C. potential at junction 19 to the reference plane 15.

In summary, delay line 14 is coupled at its input and output ends to input and output switches 1 and 5, whereby output switch 5 senses the condition of input switch 1 and reproduces a time delayed output pulse. Impedance matching for the delay line and stabilized D.C. reference potentials are provided to ensure accurate time controlled operation of the switches.

The circuit described discloses transistors 1 and 5 as P–N–P. However, this should not be taken in a limiting sense since the circuit could readily be designed using N–P–N type transistors.

It is to be understood that the above-described circuit arrangement is merely illustrative of the application of the principles of the invention. Numerous other arrangements may be devised by those skilled in the art without departing from the spirit and scope of the invention as defined by the appended claims.

What is claimed is:

1. A current mode signal delay circuit comprising an input emitter-follower transistor switch, said switch including a transistor having emitter, base and collector with a load impedance connected to said emitter, an output grounded-base transistor switch, having emitter, base and collector, a delay line including a reference plane and having one end coupled to said first-mentioned emitter and the other end coupled through a matching impedance to the emitter of said output switch, said matching impedance and said output switch providing a substantially matched termination for said other end of said delay line, a capacitor having one terminal coupled to said reference plane and to said load impedance and the other terminal coupled to ground, whereby stabilized direct current biasing potentials are provided for said switches and said delay line, the impedance of said one end of said delay line being matched by said load impedance and said capacitor, whereby the output switch senses the condition of the input switch after a predetermined time delay.

2. A current mode signal delay circuit as set forth in claim 1, including a voltage divider means coupled to said output switch for establishing the level of an output pulse in response to the condition of said output switch.

3. A current mode signal delay circuit comprising a delay line having an input and an output, a first switching means having a control terminal for actuating said means in response to a signal applied thereto, a current source direct coupled jointly to said switching means and the input of said delay line, a first matching means connected to said input to match the impedance of said input, storage means jointly connected to said delay line and to said first matching means to provide a stabilized direct current potential for said switching means and for said delay line, a second switching means, second matching means connected between the output of said delay line and said second switching means for substantially matching the impedance of said output, said first switching means closing in response to an input signal at said control terminal to divert the current of said source from said delay line into said first switching means, and said second switching means opening in response to the termination of the current of said source in said delay line, thereby to cease transmitting said current at a time delayed after the closing of said first switching means.

References Cited by the Examiner

UNITED STATES PATENTS

| | | | |
|---|---|---|---|
| 2,803,006 | 8/57 | Jacobi et al. | 328—55 |
| 2,900,533 | 8/59 | Howes | 307—88.5 |
| 3,054,072 | 9/62 | Beaulieu et al. | 307—88.5 |
| 3,091,705 | 5/63 | Levine | 307—88.5 |

ARTHUR GAUSS, *Primary Examiner.*